United States Patent
Fukasawa et al.

(10) Patent No.: US 8,654,810 B2
(45) Date of Patent: Feb. 18, 2014

(54) LIGHT-EMITTING DEVICE AND METHOD OF MANUFACTURING THE SAME

(75) Inventors: Hiroyuki Fukasawa, Tokyo (JP); Yuichi Hamaguchi, Tokyo (JP); Takeharu Asano, Kanagawa (JP); Keigo Aga, Tokyo (JP); Noriyuki Banno, Kanagawa (JP)

(73) Assignee: Sony Corporation, Tokyo (JP)

( * ) Notice: Subject to any disclaimer, the term of this patent is extended or adjusted under 35 U.S.C. 154(b) by 305 days.

(21) Appl. No.: 12/706,822

(22) Filed: Feb. 17, 2010

(65) Prior Publication Data

US 2010/0215073 A1 Aug. 26, 2010

(30) Foreign Application Priority Data

Feb. 24, 2009 (JP) ................... 2009-040756
Sep. 30, 2009 (JP) ................... 2009-228037

(51) Int. Cl.
*H01S 5/00* (2006.01)
(52) U.S. Cl.
USPC .................................... 372/50.121
(58) Field of Classification Search
USPC ............... 438/28; 257/E21.499; 372/50.121, 372/38.02
See application file for complete search history.

(56) References Cited

U.S. PATENT DOCUMENTS

| | | | |
|---|---|---|---|
| 4,901,325 A | 2/1990 | Kato et al. | |
| 5,402,436 A | 3/1995 | Paoli | |
| 5,638,391 A * | 6/1997 | Shima et al. | 372/44.011 |
| 5,664,586 A | 9/1997 | Sinclair et al. | |
| 5,999,553 A | 12/1999 | Sun | |
| 6,136,623 A | 10/2000 | Hofstetter et al. | |
| 6,956,322 B2 | 10/2005 | Ikeda | |
| 2002/0102043 A1 | 8/2002 | Shin | |
| 2006/0001055 A1 * | 1/2006 | Ueno et al. | 257/257 |
| 2007/0030872 A1 * | 2/2007 | Sato et al. | 372/50.1 |
| 2008/0111142 A1 * | 5/2008 | Furushima et al. | 257/91 |

FOREIGN PATENT DOCUMENTS

| | | |
|---|---|---|
| JP | 63-237490 | 10/1988 |
| JP | HEI 05-066330 A | 3/1993 |
| JP | HEI 05-304306 A | 11/1993 |
| JP | HEI 08-046280 A | 2/1996 |
| JP | 11-186651 | 7/1999 |
| JP | 2001-230502 | 8/2001 |
| JP | 2002-107584 A | 4/2002 |
| JP | 2004-047855 A | 2/2004 |
| JP | 2004-066543 A | 3/2004 |
| JP | 2004-515063 T | 5/2004 |
| JP | 2007-048810 | 2/2007 |
| JP | 2007-234643 | 9/2007 |
| JP | 2008-124218 | 5/2008 |

OTHER PUBLICATIONS

Japanese Patent Office, Office Action issued in Patent Application JP 2009-228037, on Dec. 1, 2010.

* cited by examiner

*Primary Examiner* — Tod T Van Roy
*Assistant Examiner* — Tuan Nguyen
(74) *Attorney, Agent, or Firm* — Dentons US LLP

(57) ABSTRACT

A light-emitting device formed by easily mounting a light-emitting element onto a supporting base and a method of manufacturing the light-emitting device are provided. A light-emitting device includes: a supporting base including a depression section on a top surface thereof, the depression section having an inclined surface on a side wall thereof; a first light-emitting element arranged on a bottom surface of the depression section; and a second light-emitting element arranged on the first light-emitting element and the supporting base.

12 Claims, 13 Drawing Sheets

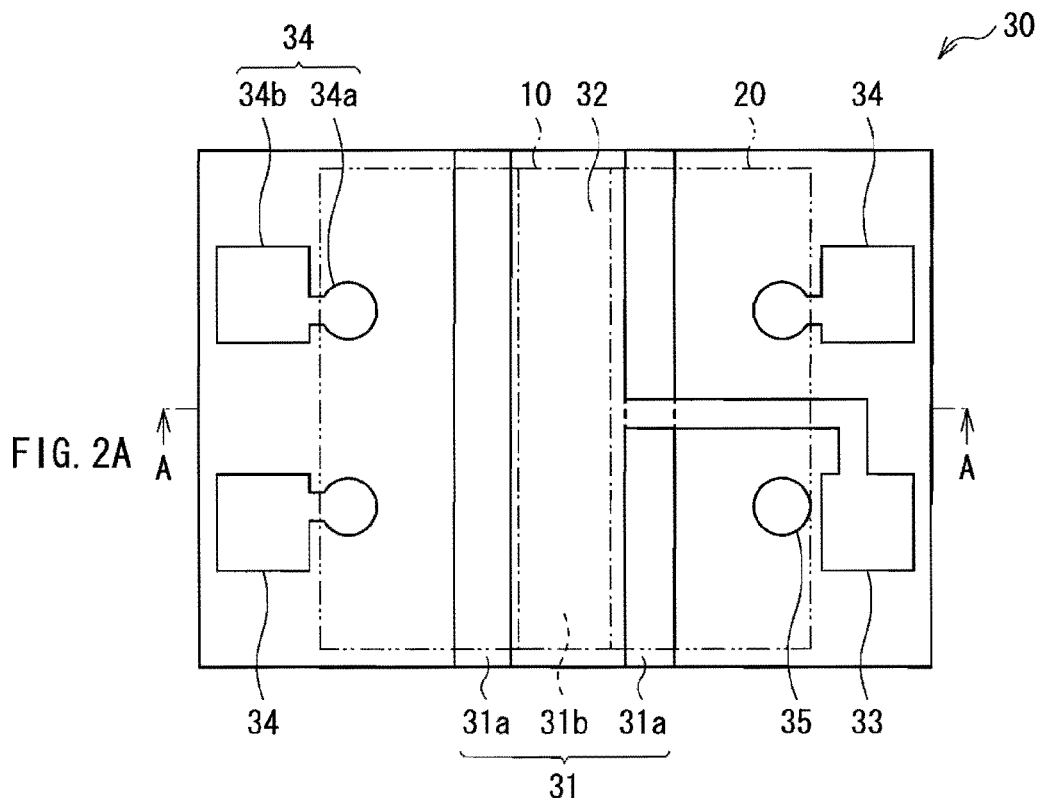
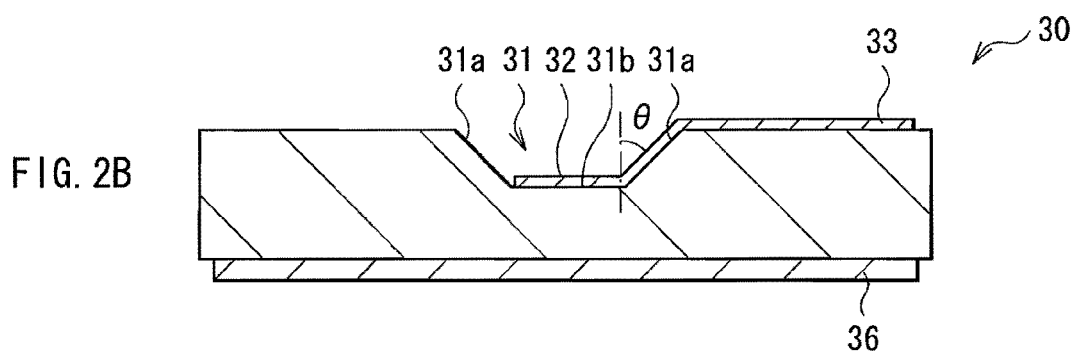

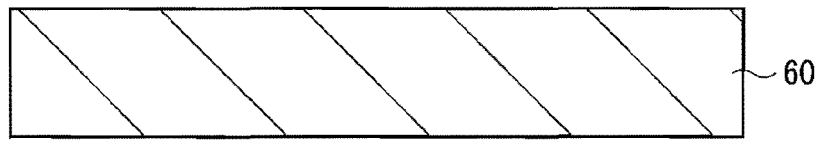
FIG. 6A
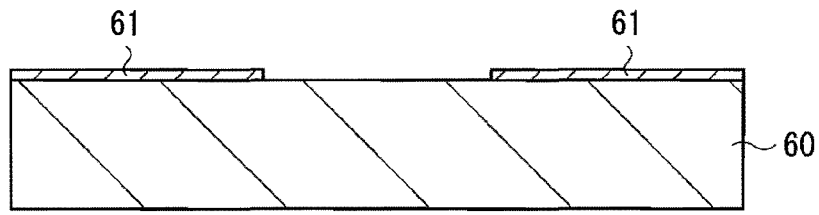
FIG. 6B
FIG. 6C
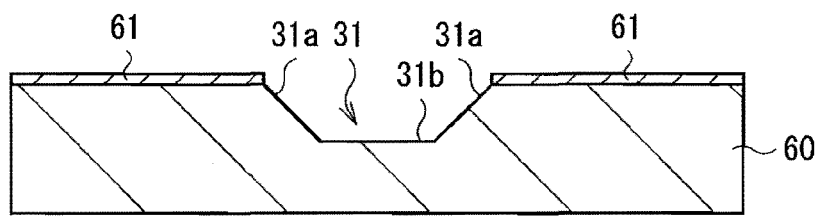
FIG. 6D
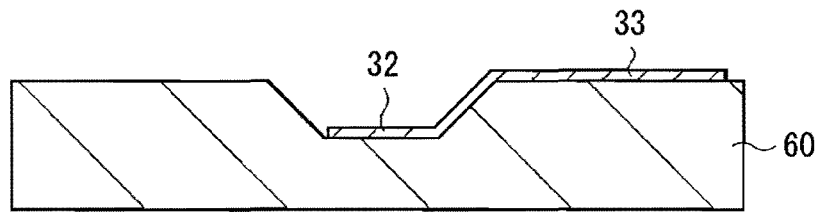
FIG. 6E
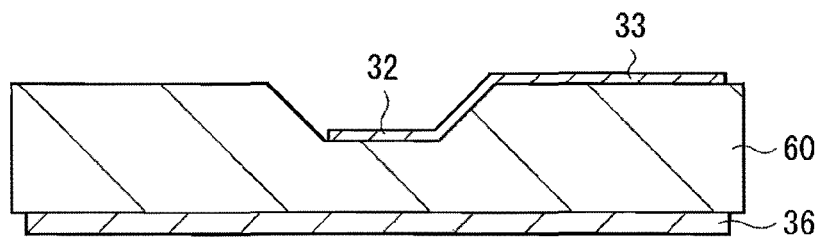

LIGHT-EMITTING DEVICE AND METHOD OF MANUFACTURING THE SAME

BACKGROUND OF THE INVENTION

1. Field of the Invention

The present invention relates to a light-emitting device including a plurality of light-emitting elements and a method of manufacturing the light-emitting device.

2. Description of the Related Art

In recent year, in the field of semiconductor lasers, multiwavelength lasers including a plurality of light-emitting sections with different emission wavelengths on a common substrate (or a common base) have been actively developed. The multiwavelength laser is used as, for example, a light source for an optical disk device.

In such an optical disk device, 700-nm-band laser light is used to replay a CD (a Compact Disk), and to record and reproduce data to/from a recordable optical disk such as a CD-R (a CD Recordable), a CD-RW (a CD Rewritable) or an MD (a Mini Disk). Moreover, 600-nm-band laser light is used to record and reproduce data to/from a DVD (a Digital Versatile Disk). When the multiwavelength laser is mounted in the optical disk device, the optical disk device is allowed to record and reproduce data to/from a plurality of kinds of already available optical disks. Moreover, a short-wavelength (400-nm band) laser using a nitride-based Group III-V compound semiconductor (hereinafter referred to as "GaN-based compound semiconductor") typified by GaN, AlGaN and GaInN has been achieved, and the short-wavelength laser has been developed for practical use as a light source for a higher-density optical disk. When lasers including the short-wavelength laser have more wavelengths, the application of the lasers is expanded.

As a three-wavelength laser element (light-emitting device) including such a GaN-based laser oscillator, for example, a three-wavelength laser element manufactured by the following method has been proposed in related art, for example in Japanese Unexamined Patent Application Publication No. 2007-48810. That is, first, a first light-emitting element with a 400-nm-band wavelength is formed by growing a GaN-based compound semiconductor on a substrate. Moreover, a 600-nm-band element formed by growing an AlGaInP-based compound semiconductor and a 700-nm-band element formed by growing an AlGaAs-based compound semiconductor are arranged in parallel on the GaAs substrate to form a second light-emitting element. Then, the first light-emitting element and the second light-emitting element are laminated in this order on a supporting base. The three-wavelength laser element is formed in such a manner in related art. In the three-wavelength laser element in related art, heat generated in the second light-emitting element is dissipated from the GaN substrate or the supporting base both of which have good thermal conductivity, so high heat dissipation efficiency is obtained.

There are disclosed two modes of the light-emitting device, that is, a first light-emitting device and a second light-emitting device. In the first light-emitting device, a first light-emitting element is mounted on a supporting base, and a plurality of columnar posts are formed on the supporting base, and then a second light-emitting element is mounted on the columnar posts and the first light-emitting element. The columnar posts have a function as a heat sink dissipating heat generated in the second light-emitting element, and a function of supplying electric power to the second light-emitting element from the supporting base side. The columnar posts are obtained by arranging tungsten or copper in predetermined positions on the supporting base by a printing method, and then firing tungsten or copper.

On the other hand, in the second light-emitting device, a depression section is formed in a supporting base, and a first light-emitting element is contained in the depression section, and a second light-emitting element is arranged on the supporting base and the first light-emitting element.

SUMMARY OF THE INVENTION

However, the above-described light-emitting devices have the following issues. First, in the first light-emitting device, columnar posts are formed by steps such as firing, so a process of forming the columnar posts takes time and effort. Moreover, as the columnar posts are shrunk during firing, the heights of the columnar posts are different from the height of the first light-emitting element, thereby a failure in bonding the second light-emitting element to the columnar posts when mounting the second light-emitting element may occur. Moreover, in the first light-emitting device, there is a possibility that the columnar posts come off due to thermal stress generated when driving the first light-emitting device.

On the other hand, in the second light-emitting device, the above-described issue caused by the columnar posts does not arise, but the following issue arises. In the second light-emitting device, as illustrated in FIG. 13A, when a first light-emitting element 100 is arranged in a depression section 102 of a supporting base 101, a bottom surface of the first light-emitting element 100 may touch or strike a corner around an entrance of the depression section 102. Therefore, an accurate positioning mechanism is necessary for a mounting apparatus 103.

Moreover, in the case where the supporting base 101 is made of aluminum nitride, a side surface of the depression section 102 is uneven. In the case where the first light-emitting element 100 is arranged in the depression section 102 having such an uneven side surface, when it is difficult to accurately position the first light-emitting element 100, as illustrated in FIG. 13B, a corner of a bottom surface of the first light-emitting element 100 may get stuck by the uneven side surface of the depression section 102. Therefore, in some cases, the first light-emitting element 100 is obliquely arranged in the depression section 102. In such a case, the first light-emitting element 100 is not mounted in a predetermined position, so target emission light characteristics are not obtainable in a right form, and the second light-emitting element is not allowed to be mounted. In addition, the whole bottom surface of the first light-emitting element 100 is not bonded to the supporting base 101, so issues such as the first light-emitting element 100 coming off during operation thereby to lose a desired function may arise.

Further, in the second light-emitting device, the supporting base 101 is formed by firing ceramic or the like, but there is such an issue that the depth of the depression section 102 is not equal to the height of the first light-emitting element 100 due to variations in shrinkage which occurs during firing. In other words, a surface of the first light-emitting element 100 after being mounted in the depression section 102 and a surface of the supporting base 101 are not arranged on the same horizontal plane. In such a case, when the second light-emitting element (not illustrated) is arranged, the second light-emitting element is insufficiently bonded to the supporting base 101.

It is desirable to provide a light-emitting device formed by easily mounting a light-emitting element onto a supporting base, and a method of manufacturing the light-emitting device.

According to an embodiment of the invention, there is provided a light-emitting device including: a supporting base including a depression section on a top surface thereof, the depression section having an inclined surface on a side wall thereof; a first light-emitting element arranged on a bottom surface of the depression section; and a second light-emitting element arranged on the first light-emitting element and the supporting base.

According to an embodiment of the invention, there is provided a first method of manufacturing a light-emitting device including: a first step of forming a depression section on a supporting base, the depression section having an inclined surface on a side wall thereof; a second step of fixing a first light-emitting element to a bottom surface of the depression section of the supporting base with a first bonding material; and a third step of fixing a second light-emitting element on the first light-emitting element and the supporting base with a second bonding material.

According to an embodiment of the invention, there is provided a second method of manufacturing a light-emitting device including: a first step of forming a depression section on a supporting base, the depression section having an inclined surface on a side wall thereof; a second step of bonding a second light-emitting element to a first light-emitting element with a first bonding material, the second light-emitting element having a larger width than that of the first light-emitting element; and a third step of fixing the first light-emitting element to a bottom surface of the depression section of the supporting base, and at the same time, fixing the second light-emitting element to a top surface of the supporting base.

In the light-emitting device and the first and second methods of manufacturing a light-emitting device according to the embodiment of the invention, a side wall of the depression section is inclined, so in an assembling step, even if the first light-emitting element is placed on the side wall of the depression section, the first light-emitting element is slid down so as to be arranged on a bottom surface of the depression section.

In the light-emitting device and the methods of manufacturing a light-emitting device according to the embodiment of the invention, a side wall of the depression section arranged in the supporting base is inclined, so even if the first light-emitting element is not accurately positioned when bonding the first light-emitting element to the supporting base, the first light-emitting element is slid along the inclined surface, thereby the first light-emitting element is allowed to be bonded to the bottom surface of the depression section. Therefore, the first light-emitting element is allowed to be easily mounted onto the supporting base.

Other and further objects, features and advantages of the invention will appear more fully from the following description.

BRIEF DESCRIPTION OF THE DRAWINGS

FIGS. 2A and 2B are a schematic plan view and a schematic sectional view of a supporting base, respectively.

FIGS. 6A to 6E are sectional views for describing steps of manufacturing a supporting base according to a modification.

DETAILED DESCRIPTION OF THE PREFERRED EMBODIMENTS

Figure 1:
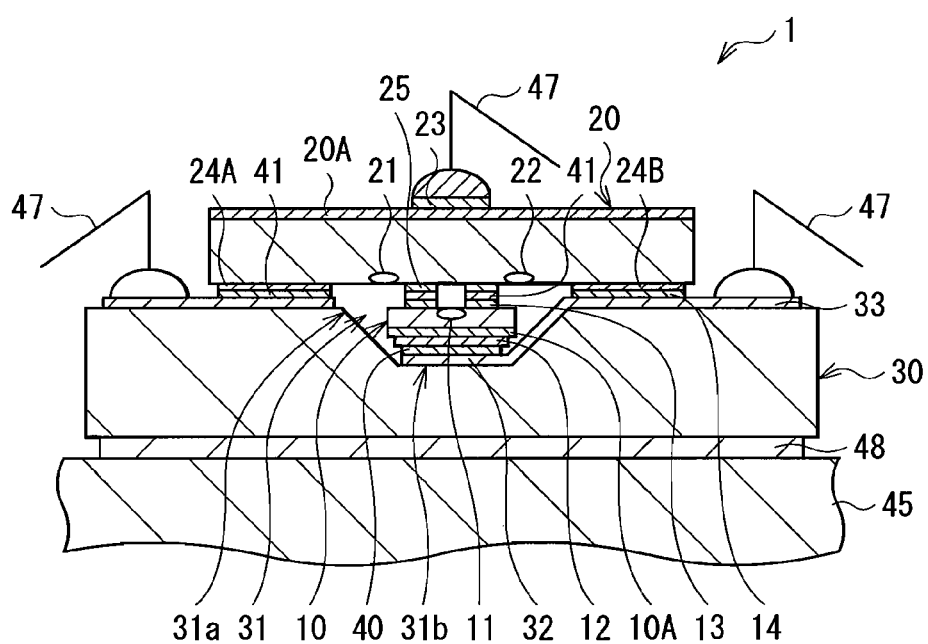
FIG. 1 is a sectional view of the whole configuration of a light-emitting device according to an embodiment of the invention.

A preferred embodiment will be described in detail below referring to the accompanying drawings. Descriptions will be given in the following order.
1. Embodiment (an example in which first and second light-emitting elements are mounted on a supporting base)
2. Modifications
Embodiment
Light-Emitting Device FIG. 1 illustrates a sectional view of a light-emitting device 1 according to an embodiment of the invention. The light-emitting device 1 is suitably used as a light source for an optical disk device recording and reproducing data to/from an optical disk.

The light-emitting device 1 includes a chip-shaped first light-emitting element 10 and a chip-shaped second light-emitting element 20 which are laminated in this order on a supporting base (a submount) 30, and has a function as a multiwavelength laser element. For example, the supporting base 30 is arranged on a heat block 45 with a bonding layer 48 in between. In this case, the bonding layer 48 is made of, for example, a metal alloy such as Au (gold)-Si (silicon), Au (gold)-Sn (tin) or Ag (silver)-Sn (tin), a resin adhesive or the like. The heat block 45 is made of, for example, a metal material such as copper or iron.

The first light-emitting element 10 is a semiconductor laser emitting, for example, 400-nm-band (for example, 405-nm) laser light from a light-emitting point (a lasing section) 11, and is made of a GaN-based compound semiconductor. In the first light-emitting element 10, a GaN substrate 10A having a high thermal conductivity of approximately 130 W/(m·K) is used, and the GaN substrate 10A functions as a heat sink dissipating heat generated in the light-emitting elements 10 and 20. In the first light-emitting element 10, an n-side electrode 12 (a fourth electrode) and a p-side electrode 13 (a third electrode) are arranged on a top surface and a bottom surface thereof, respectively.

The second light-emitting element 20 is a monolithic multiwavelength laser, and includes two kinds of semiconductor laser configurations emitting, for example, 600-nm-band (for example, 650-nm) laser light and 700-nm-band (for example, 780-nm) laser light from two light-emitting points (lasing sections) 21 and 22, respectively. The second light-emitting element 20 is arranged on the supporting base 30 in a so-called junction down configuration in which two light-emitting points 21 and 22 are arranged close to the light-emitting point 11 of the first light-emitting element 10. A 600-nm-band laser configuration and a 700-nm-band laser configuration are made of an AlGaInP-based compound semiconductor and an AlGaAs-based compound semiconductor, respectively. In the second light-emitting element 20, a GaAs substrate 20A having a low thermal conductivity of approximately 17.8 W/(m·K) is used. That is, in the embodiment, heat generated in the second light-emitting element 20 is conducted not to the GaAs substrate 20A but to the heat block 45 through the first light-emitting element 10 and the supporting base 30.

The second light-emitting element 20 includes two p-side electrodes 24A and 24B (seventh electrodes) and a wiring pattern 25 (a sixth electrode) on a bottom surface thereof. Moreover, the second light-emitting element 20 includes an n-side electrode 23 (a common electrode) (a fifth electrode) on a top surface thereof. The p-side electrode 24A corresponds to a p-side electrode of an element on the light-emitting point 21 side, and the p-side electrode 24B corresponds to a p-side electrode of an element on the light-emitting point 22 side.

The supporting base 30 is made of, for example, silicon having a high thermal conductivity of approximately 250 W/(m·K), and has a function as a heat sink dissipating heat generated in the first light-emitting element 10 and the second light-emitting element 20.

FIGS. 2A and 2B illustrates the supporting base 30. FIGS. 2A and 2B illustrates a plan view and a sectional view taken along a line A-A of FIG. 2A, respectively. In the supporting base 30, a depression section 31 is formed on a top surface side thereof. The depression section 31 has a mountable size for the whole first light-emitting element 10, and has an inverted trapezoidal shape. In other words, the depression section 31 has inclined surfaces 31a on side walls, and the sectional area of the depression section 31 is gradually increased with a distance from the bottom surface 31b to which the first light-emitting element 10 is bonded. An angle θ of the inclined surface 31a with respect to a plane perpendicular to the bottom surface 31b is formed by forming the inclined surface 31a by a silicon anisotropic etching method, so the angle θ is a crystal orientation of 54.74 degrees. Thereby, in an assembling step, a possibility that the bottom surface of the first light-emitting element 10 touches or strikes a corner around an entrance of the depression section 31 is eliminated. Moreover, the depression section 31 has a depth to an extent to which the surface of the first light-emitting element 10 arranged on the bottom surface 31b and the top surface of the supporting base 30 are arranged on substantially the same plane.

A mount electrode 32 (a second electrode) is arranged on the bottom surface 31b of the depression section 31, and a pad electrode 33 is arranged on a top surface of the supporting base 30. The mount electrode 32 and the pad electrode 33 each are made of, for example, a metal material such as gold. The mount electrode 32 extends along the inclined surface 31a, and is electrically connected to the pad electrode 33. The mount electrode 32 is arranged in a position where the first light-emitting element 10 is mounted of the supporting base 30. The mount electrode 32 has a function of supplying electric power supplied through a wire 47 (refer to FIG. 1) bonded to the pad electrode 33 to one (in this case, the n-side electrode 12) of electrodes of the first light-emitting element 10 when driving the first light-emitting element 10.

For example, a pair of bonding electrodes 34 (first electrodes) are arranged on a top surface (a top surface section except for the depression section 31) so as to sandwich the depression section 31 therebetween, and another bonding electrode 34 and a dummy electrode 35 are arranged on the top surface so as to sandwich the depression section 31 therebetween. The bonding electrodes 34 have a function of supplying electric power to the first light-emitting element 10 and the second light-emitting element 20. Each of the bonding electrodes 34 has a circular section 34a and a pad section 34b. A lower electrode (a p-side electrode 24A) of the second light-emitting element 20 is bonded to the circular section 34a, and the wire 47 (refer to FIG. 1) is bonded to the pad section 34b. The dummy electrode 35 is arranged separately from but near the pad electrode 33. The dummy electrode 35 is used when the second light-emitting element 20 is mounted onto the supporting base 30.

A mount pattern 36 is arranged on a bottom surface (that is, a surface fixed to the heat block 45) of the supporting base 30. In this case, the mount electrode 32, the pad electrode 33, the bonding electrodes 34 and the dummy electrode 35 are made of, for example, Au (gold) having a high thermal conductivity of approximately 300 W/(m·K), and function as heat sinks dissipating heat generated in the first light-emitting element 10 and the second light-emitting element 20.

The n-side electrode 12 of the first light-emitting element 10 is bonded to the mount electrode 32 in the depression section 31 with a conductive bonding material 40. The conductive bonding material 40 is made of, for example, a metal alloy such as Au (gold)-Si (silicon), Au (gold)-Sn (tin) or Ag (silver)-Sn (tin), a resin adhesive or the like. The conductive bonding material 40 provides electrical conduction between the n-side electrode 12 of the first light-emitting element 10 and the mount electrode 32, and firmly bonds the first light-emitting element 10 to the supporting base 30. The p-side electrode 13 of the first light-emitting element 10 is positioned on substantially the same plane as that where the bonding electrodes 34 on the supporting base 30 is positioned, and the heights of the p-side electrode 13 and the bonding electrodes 34 are equal to each other.

The p-side electrodes 24A and 24B of the second light-emitting element 20 are bonded to the pair of bonding electrodes 34 on the supporting base 30. The wiring pattern 25 is also bonded to another bonding electrode 34 and the p-side electrode 13 of the first light-emitting element 10. The same conductive bonding material 41 as described above may be used for each bonding. In the case where a metal alloy is used for bonding between each of the electrodes of the second light-emitting element 20 and each of the electrodes on the supporting base 30 and the electrode on the first light-emitting element 10, as the metal alloy, a metal alloy having a lower melting point than that of a metal alloy used for bonding between the electrode on the first light-emitting element 10 and the electrode on the supporting base 30 is preferably used, because the metal alloy used for bonding the first light-emitting element 10 is prevented from being melted by heat generated at the time of bonding the second light-emitting element 20.

Figure 3:
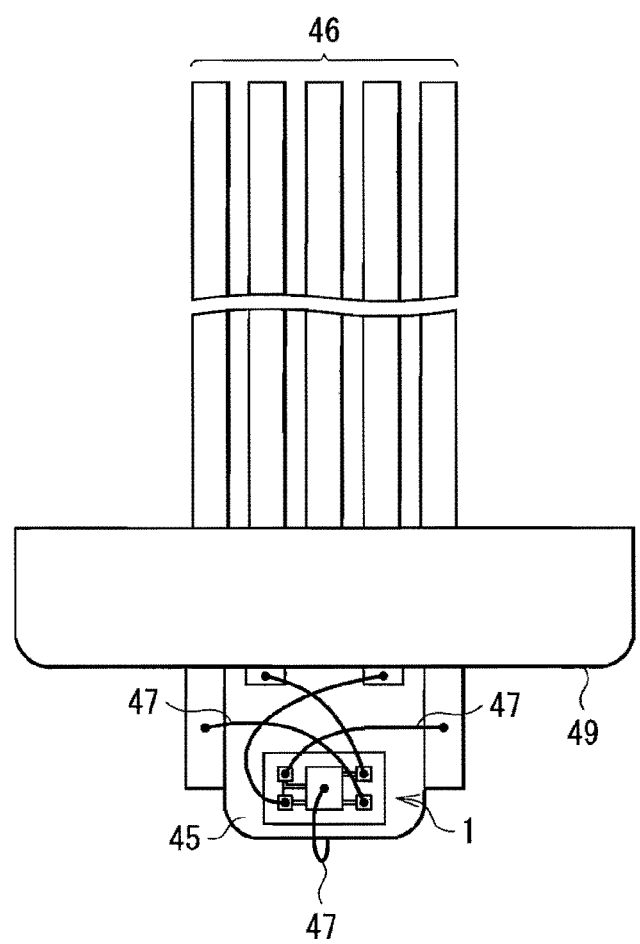
FIG. 3 is a plan view of a package.

FIG. 3 illustrates a state in which the light-emitting device 1 with such a configuration is mounted together with the heat block 45 in a package 49. The wire 47 drawn from a connection terminal 46 of the package 49 is connected to each of the pad electrode 33, the bonding electrodes 34 and the n-side electrode 23 of the second light-emitting element 20.

Manufacturing Method

Next, a method of manufacturing the light-emitting device 1 will be described below. Steps of manufacturing the supporting base 30 and steps of mounting the first light-emitting element 10 onto the supporting base 30 will be separately described below.

Steps of Manufacturing Supporting Base

First, the steps of manufacturing the supporting base 30 will be described referring to FIGS. 4A to 4F. Two single-crystal silicon substrates 50 and 51 are prepared. Next, an oxidized film 52 is formed on both or one of surfaces facing each other of the silicon substrates 50 and 51, and the silicon substrates 50 and 51 are bonded together so that the oxidized film 52 is sandwiched between the silicon substrates 50 and 51, thereby to form a SOI (Silicon on Insulator) substrate (refer to FIG. 4A). Next, to form the depression section 31, a mask 53 is formed on a top surface of the silicon substrate 51 (refer to FIG. 4B).

Figure 4A:
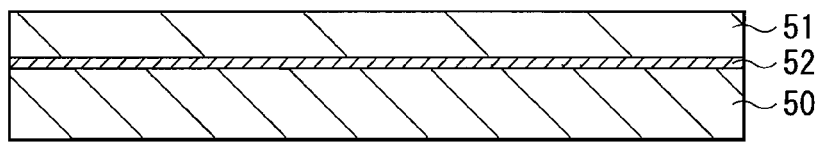
FIGS. 4A to 4F are sectional views for describing steps of manufacturing the supporting base.
Figure 4B:
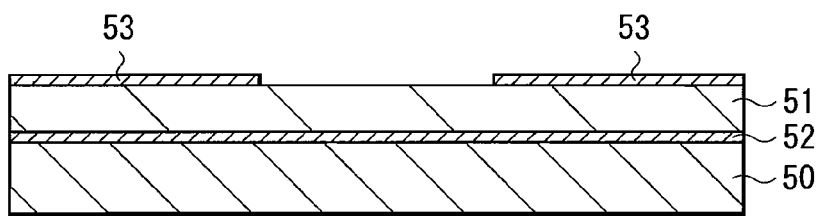
Figure 4C:
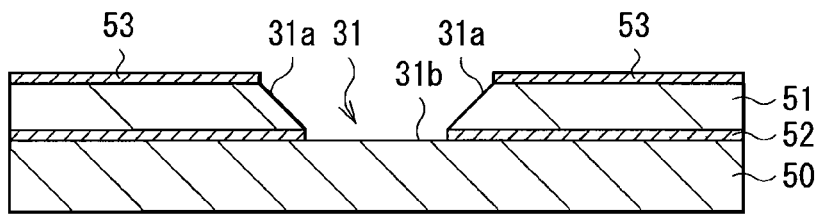
Figure 4D:
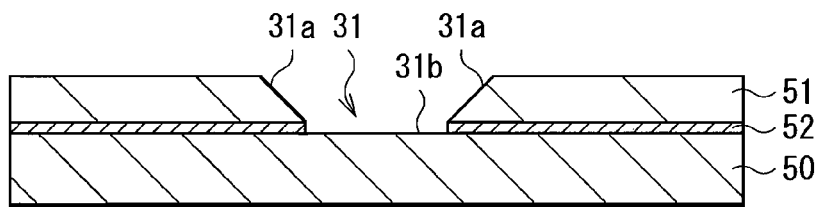

After that, a part exposed to an opening of the mask 53 of the silicon substrate 51 is etched to form the depression section 31 (refer to FIG. 4C). At this time, the inclined surface 31a is formed on a side wall of the depression section 31 by using an etching rate difference between a (100) plane and a (111) plane of a crystal lattice of the silicon substrate 51 and using a silicon anisotropic etching method in which etching conditions are optimized. The angle θ of the inclined surface 31a with respect to a horizontal plane is 52°. Moreover, when the oxidized film 52 is exposed to the bottom surface of the depression section 31, etching to a downward direction stops because of a difference between etching rates of the silicon substrate 51 and the oxidized film 52. Thereby, the depth of the depression section 31 is controlled so as to correspond to the thickness of the silicon substrate 51. When such etching is completed, a part exposed to the bottom surface of the depression section 31 of the oxidized film 52 is removed, and the mask on the silicon substrate 51 is removed (refer to FIG. 4D).

Figure 4E:
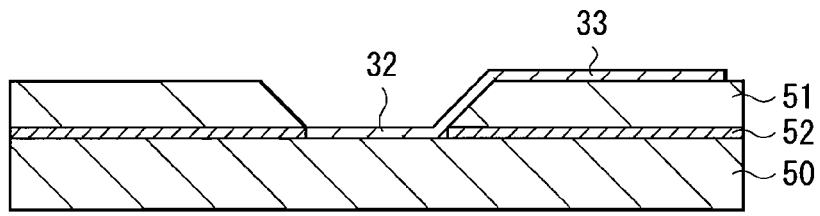
Figure 4F:
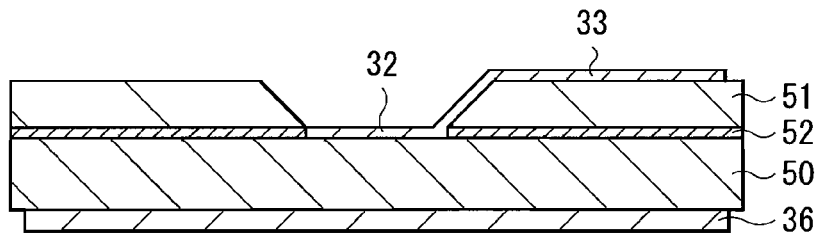

Next, the mount electrode 32, the pad electrode 33, the bonding electrodes 34 and the dummy electrode 35 are formed of, for example, a metal material such as gold (refer to FIG. 4E). Each of the electrodes 32 to 35 is formable, for example, by forming a film of a metal material on the whole silicon substrate 51, and then forming a mask with a shape patterned after the shape of each electrode on the metal material, and removing a part exposed to an opening of the metal material, and then removing the mask. After that, the mount pattern 36 is formed on the bottom surface of the silicon substrate 50 (refer to FIG. 4F). Thereby, the supporting base 30 in the embodiment is completed.

Steps of Mounting First Light-Emitting Element

Next, the steps of mounting the first light-emitting element 10 into the depression section 31 of the supporting base 30 will be described below referring to FIGS. 5A to 5C. In this case, the first light-emitting element 10 may be accurately positioned so as to face the bottom surface 31b of the depression section 31, and then the first light-emitting element 10 may be bonded to the mount electrode 32 of the depression section 31. Even if it is difficult to accurately position the first light-emitting element 10, the first light-emitting element 10 is allowed to be accurately bonded to the mount electrode 32.

Figure 5A:
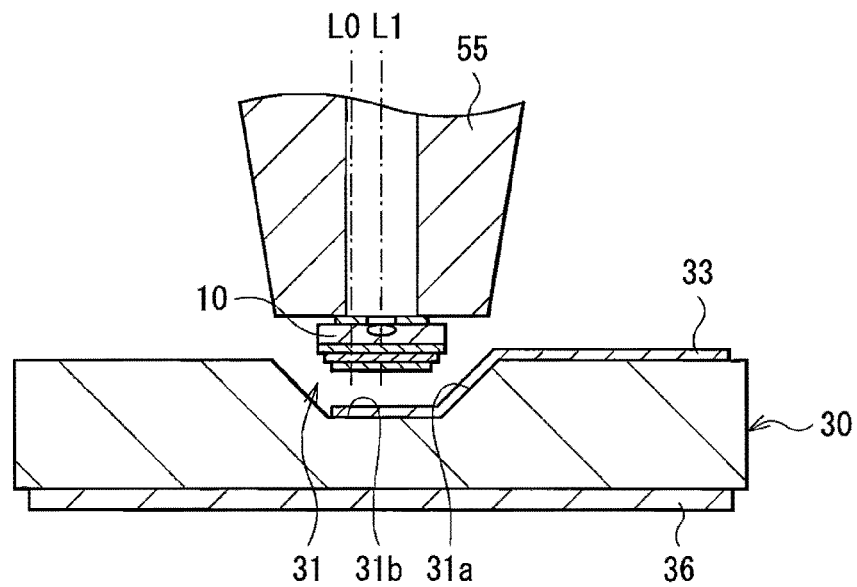
FIGS. 5A to 5C are sectional views for describing steps of mounting a first light-emitting element onto the supporting base.
Figure 5B:
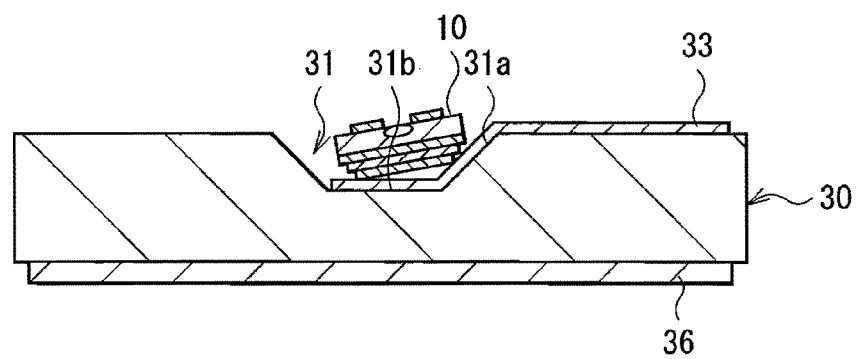
Figure 5C:
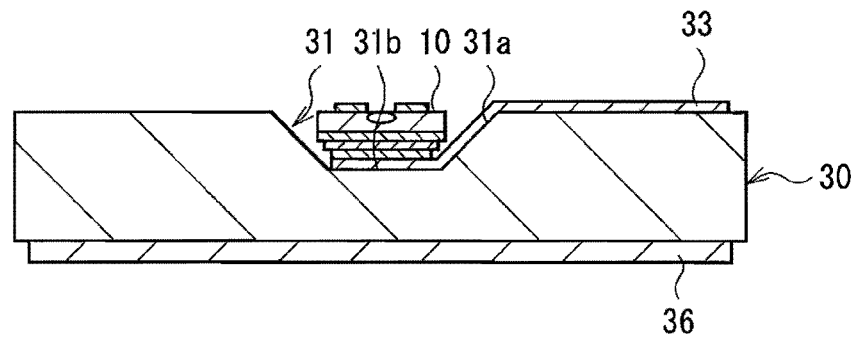

That is, as illustrated in FIG. 5A, in the case where the first light-emitting element 10 held by an absorption apparatus 55 is positioned at a position L1 deviated from a set position L0, a corner of the first light-emitting element 10 faces the inclined surface 31a of the depression section 31. Then, when the absorption apparatus 55 stops absorbing the first light-emitting element 10 in this state, the first light-emitting element 10 is inclined so that another corner thereof touches the mount electrode 32 (refer to FIG. 5B). In this case, in the embodiment, one corner of the first light-emitting element 10 is slid down along a smooth inclination of the inclined surface 31a of the depression section 31 to reach a predetermined position (the bottom surface 31b), that is, the mount electrode 32, and then the first light-emitting element 10 is bonded to the mount electrode 32 (refer to FIG. 5C). In the case where a metal alloy is used as the conductive bonding material 40 used for bonding the first light-emitting element 10 in this case, the metal alloy may be arranged on one or both of the n-side electrode 12 of the first light-emitting element 10 and the mount electrode 32. Moreover, the thickness of the silicon substrate 51 in which the depression section 31 is formed is set so as to be equal to the height of the first light-emitting element 10, so the p-side electrode 13 of the first light-emitting element 10 and the bonding electrodes 34 and the dummy electrode 35 are arranged on substantially the same plane.

After that, as illustrated in FIG. 1, the second light-emitting element 20 is bonded to the first light-emitting element 10 and the supporting base 30. More specifically, the conductive bonding material 41 is arranged on the p-side electrode 13 of the first light-emitting element 10, the bonding electrodes 34 and the dummy electrode 35, or/and the p-side electrode 24 and the wiring pattern 25 of the second light-emitting element 20. In this state, the second light-emitting element 20 may be positioned so as to be mounted onto the first light-emitting element 10 and the supporting base 30. In the case where an metal alloy is used for each of the conductive bonding materials 40 and 41, as a metal alloy used for bonding the second light-emitting element 20, a metal alloy with a lower melting point than that of a metal alloy used for bonding the first light-emitting element 10 is preferably used, because the metal alloy used for bonding the first light-emitting element 10 is prevented from being melted by heat generated when bonding the second light-emitting element 20. Moreover, in the case where the conductive bonding material 41 is arranged on the bonding electrodes 34, the dummy electrode 35 and the p-side electrode 13 of the first light-emitting element 10, the electrodes 34, 35 and 13 are positioned on substantially the same plane, so a technique of printing a paste-form metal alloy including flux may be used.

Next, the supporting base 30 is fixed to the heat block 45 on the package 49, and then the wire 47 are bonded between each of the pad electrode 33, the pad sections 34b of the bonding electrodes 34 and the n-side electrode 23 of the second light-emitting element 20, and the connection terminal 46 on the package 49 side.

In addition, in the above-described embodiment, the supporting base 30 has an individual block shape, but the supporting base 30 may have a sheet shape. In other words, a plurality of depression sections 31 are arranged in a sheet-shaped supporting base, and the first light-emitting element 10 is arranged in each of the depression sections 31, and the second light-emitting element 20 is mounted on the first light-emitting element 10, and they are cut into pieces to form the light-emitting devices 1. Thereby, compared to the case where the light-emitting device 1 is manufactured one by one, effort and time for manufacturing the light-emitting device 1 is allowed to be reduced.

Functions

Figure 13A:
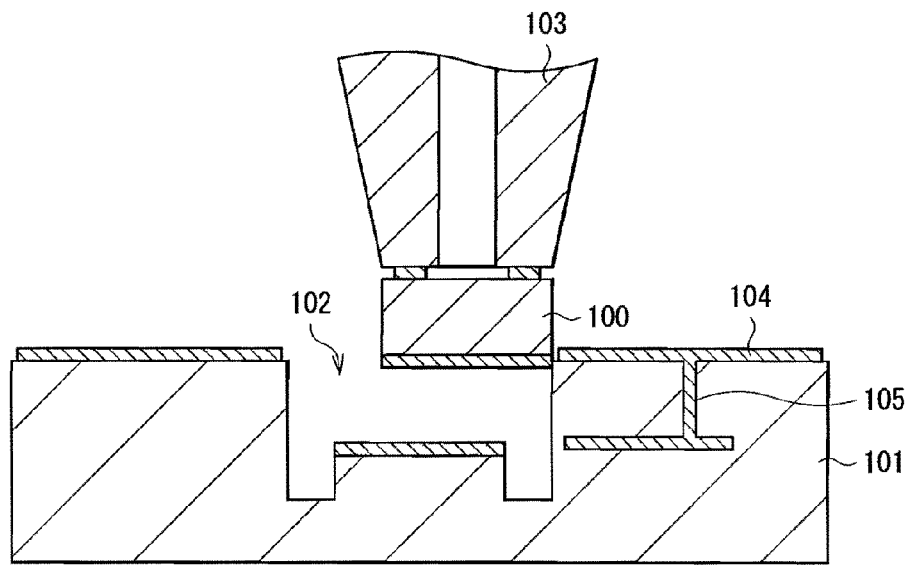
FIGS. 13A and 13B are sectional views when a first light-emitting element in related art is mounted onto a supporting base.
Figure 13B:
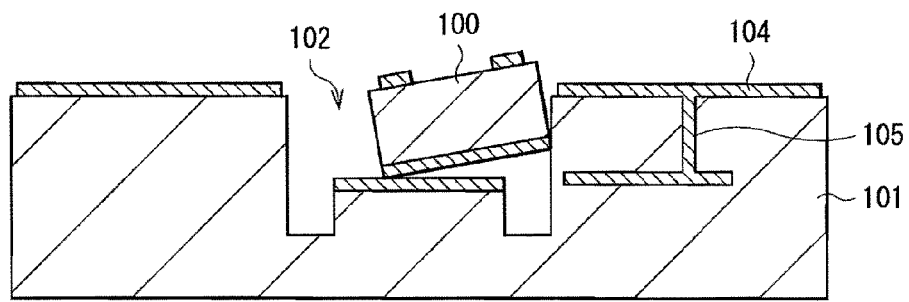

Next, functions of the light-emitting device 1 will be described below. First, thermal conduction of a wiring material in a second light-emitting device described referring to FIG. 13 as a comparative example will be described. In the second light-emitting device, heat generated in a first light-emitting element 100 is dissipated through a supporting base 101. However, in the second light-emitting device, wiring 104 is drawn long, and a via hole 105 is formed, so the thermal conductivity of the wiring 104 is low. Therefore, heat dissipation from wiring drawn in the supporting base 101 is not expected.

Next, functions of the light-emitting device 1 according to the embodiment will be described below. In the light-emitting device 1, when a voltage from a power source is applied between the n-side electrode 12 and the p-side electrode 13 of the first light-emitting element 10 through the connection terminal 46, 400-nm-band laser light is emitted from the light-emitting point 11 of the first light-emitting element 10. Likewise, when a voltage is applied between the n-side electrode 26 of the second light-emitting element 20 and the p-side electrode 24A arranged in a laser configuration emitting 600-nm-band laser light, 600-nm-band laser light is emitted from the light-emitting point 21 of the second light-emitting element 20. Moreover, likewise, when a voltage is applied between the n-side electrode 26 of the second light-emitting element 20 and the p-side electrode 24B arranged in a laser configuration emitting 700-nm-band laser light, 700-nm-band laser light is emitted from the light-emitting point 22 of the second light-emitting element 20. In other words, laser light of one band selected from bands of 400 nm, 600 nm and 700 nm is emitted from the light-emitting device 1.

In the case where laser light is emitted from the light-emitting elements 10 and 20, Joule heat by a high current density is generated in the light-emitting elements 10 and 20. In this case, the mount electrode 32 and the pat electrode 33 formed on the supporting base 30 are electrically connected to each other via a shortest path, and a distance between the circular section 34a and the pad section 34b of each bonding electrode 34 is short, so thermal conductivity is good (high). Therefore, heat generated in the first light-emitting element 10 is dissipated from the first light-emitting element 10, and is conducted to the supporting base 30 and the mount electrode 32 which have good thermal conductivity to be dissipated from them. Moreover, heat generated in the second light-emitting element 20 is dissipated from the second light-emitting element 20, and is conducted to the first light-emitting element 10, the supporting base, 30, the bonding electrodes 34, the dummy electrode 35 and the like which have good thermal conductivity to be dissipated from them.

In the embodiment, a side wall of the depression section 31 arranged in the supporting base 30 is the inclined surface 31a. Thereby, even if the first light-emitting element 10 is not accurately positioned when bonding the first light-emitting element 10 to the supporting base 30, the first light-emitting element 10 is slid down along the inclined surface 31a to move to the bottom surface 31b of the depression section 31, so the first light-emitting element 10 is allowed to be bonded to the bottom surface 31b. In other words, it is not necessary to mount the first light-emitting element 10 to the supporting base 30 by a mounting apparatus including an accurate positioning mechanism. Moreover, when the first light-emitting element 10 is mounted onto the supporting base 30, the first light-emitting element 10 is not inclined. Thereby, target emission light characteristics are obtainable, and the second light-emitting element 20 is allowed to be reliably mounted, and coming off of the first light-emitting element 10 during using the light-emitting device 1 is preventable.

Moreover, the first light-emitting element 10 and the second light-emitting element 20 are bonded to the supporting base 30, so unlike related art, it is not necessary to form columnar posts, and effort and time is not necessary to manufacture the supporting base 30, and the columnar posts do not come off. Therefore, the first light-emitting element 10 is allowed to be easily mounted onto the supporting base 30, and reliability of the light-emitting device 1 is improved.

Further, the inclined surface 31a of the depression section 31 is inclined, so a pattern providing electrical conduction between the mount electrode 32 and the pad electrode 33 is allowed to be drawn on the inclined surface 31a via a shortest path. Moreover, a high heat dissipation material such as gold is used for the mount electrode 32, the bonding electrodes 34, the dummy electrode 35 and the like, so heat is dissipated from not only the supporting base 30 but also the electrodes 32, 34 and 35 and the like, so heat dissipation of each light-emitting element is improved.

Moreover, the supporting base 30 is manufactured by using the SOI substrate, so the inclined surface 31a of the depression section 31 is obliquely formed by a difference in etching rate by a silicon crystal structure, or the like. Further, the depth of the depression section 31 is allowed to become equal to the thickness from the top surface of the silicon substrate 51 to the oxidized film 52 by a difference between etching rates of the silicon substrate 51 an the oxidized film 52. Therefore, the depression section 31 is formed with high reproducibility.

Further, the depth of the depression section 31 and the height of the first light-emitting element 10, that is, the heights of the bonding electrodes 34 and the dummy electrode 35 formed on the supporting base 30 and the height of the n-side electrode 12 of the first light-emitting element 10 are equal to each other, so the second light-emitting element 20 is reliably mounted onto the first light-emitting element 10 and the supporting base 30.

Moreover, in the case where the first light-emitting element 10 and the second light-emitting element 20 are bonded in this order to the supporting base 30 with a metal alloy, the melting point of the metal alloy used for bonding the second light-emitting element 20 is lower than the melting point of a metal alloy used for bonding the first light-emitting element 10. Thereby, when the second light-emitting element 20 is bonded, the metal alloy used for bonding the first light-emitting element 10 is prevented from being melted to displace the first light-emitting element 10.

Modifications

Modifications of the embodiment will be described below.

In the above-described embodiment, the case where the supporting base 30 is manufactured by using the SOI substrate is described. However, the supporting base 30 may be manufactured by using a silicon substrate. FIGS. 6A to 6E illustrate schematic sectional views for describing steps of manufacturing the supporting base 30 according to a modification. As illustrated in FIG. 6A, to manufacture the supporting base 30, a silicon substrate 60 is prepared. Next, a mask 61 is formed on a top surface of the silicon substrate 60 (refer to FIG. 6B), and a part exposed to an opening of the mask 61 of the silicon substrate 60 is etched. When an etching depth reaches a predetermined depth, etching is ended to form the depression section 31 (refer to FIG. 6C). At this time, as in the case of the SOI substrate, the inclined surface 31a of the depression section 31 is inclined through the use of a difference in etching rate by a crystal structure and a silicon anisotropic etching method. Next, after removing the mask 61, the mount electrode 32, the pad electrode 33, the bonding electrodes 34 and the dummy electrode 35 are formed on the silicon substrate 60 (refer to FIG. 6D), and the mount pattern 36 is formed below the silicon substrate 60 (refer to FIG. 6E). Even if such a silicon substrate 60 is used, the supporting base 30 is obtainable.

Moreover, in the above-described embodiment, the case where the first light-emitting element 10 is mounted onto the supporting base 30, and then the second light-emitting element 20 is mounted is described. However, the first light-emitting element 10 and the second light-emitting element 20 may be bonded together first, and then the first light-emitting element 10 and the second light-emitting element 20 may be mounted onto the supporting base 30. In the case where the first light-emitting element 10 and the second light-emitting element 20 are mounted onto the supporting base 30, the conductive bonding materials 40 and 41 may be arranged on the n-side electrode 12 of the first light-emitting element 10 and the p-side electrode 24 and the wiring pattern 25 of the second light-emitting element 20 or/and the mount electrode 32, the bonding electrodes 34 and the dummy electrode 35. As the conductive bonding materials 40 and 41, in addition to the metal alloy or a conductive adhesive, a bump or a stud bump may be used. The stud bump is formed by sparking a thin wire made of a metal alloy or the like to form a ball at an end of the thin wire, and bonding the ball to each of the electrodes 12, 20, 24, 25 and 32 to 35 using weight, an ultrasonic wave, heat or the like. Moreover, as the conductive bonding materials 40 and 41, a material called a ribbon formed by flatly spreading a metal alloy may be used. In addition, the ribbon is bonded to each of the electrodes 12, 20, 24, 25 and 32 to 35 by arranging the ribbon on each of the electrodes 12, 20, 24, 25 and 32 to 35, and applying weight, an ultrasonic wave or the like.

Further, in this case, when the metal alloy is used for the conductive bonding materials 40 and 41, it is necessary for the melting point of a metal alloy used for bonding the first light-emitting element 10 and the second light-emitting element 20 together to be higher than the melting point of a metal alloy used for bonding the light-emitting elements 10 and 20 to the supporting base 30. Thereby, when the light-emitting elements 10 and 20 are bonded to the supporting base 30, the metal alloy used for bonding the second light-emitting element 20 is prevented from being melted to displace the second light-emitting element 20.

Figure 7A:
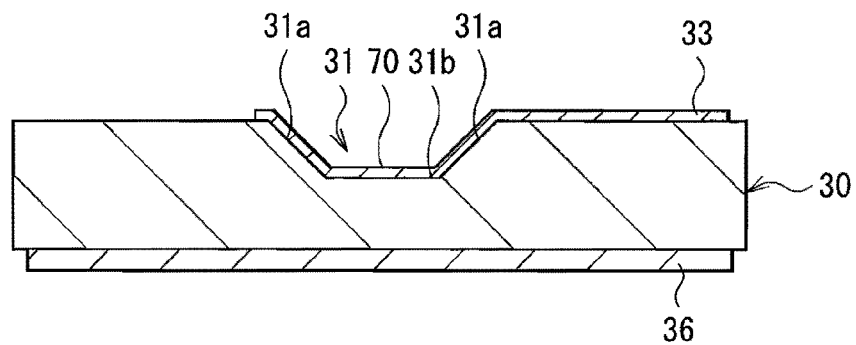
FIGS. 7A and 7B are a sectional view and a plan view of a supporting base for describing a modification of a mount electrode, respectively.
Figure 7B:
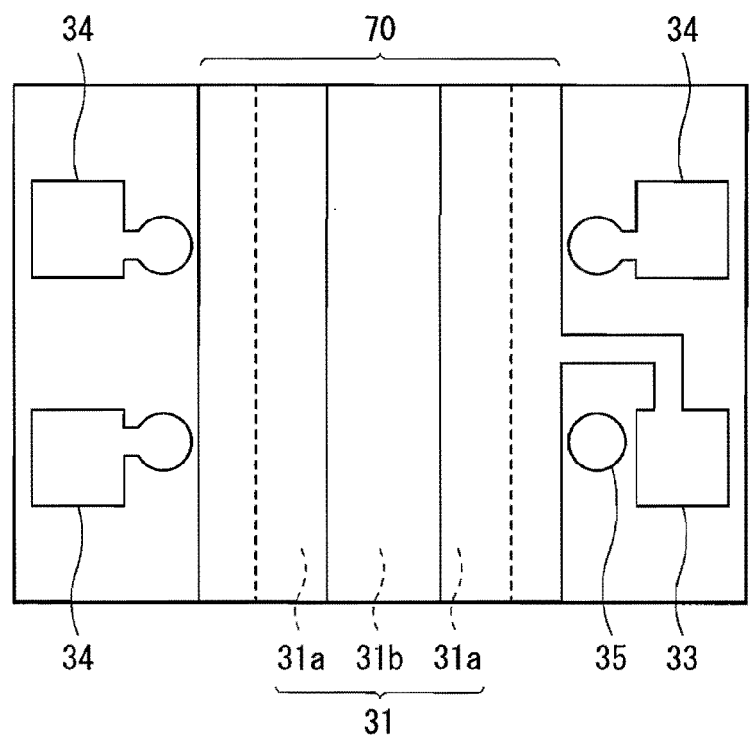

FIGS. 7A and 7B illustrate a schematic configuration of the supporting base 30 for describing a modification of the mount electrode. FIG. 7A is a sectional view and FIG. 7B is a plan view. In the above-described embodiment, the case where the mount electrode 32 is arranged on only the bottom surface 31b of the depression section 31 is described, but as illustrated in FIGS. 7A and 7B, a mount electrode 70 may be arranged on the bottom surface 31b and the inclined surface 31a of the depression section 31 and a top surface of the supporting base 30. The mount electrode 70 is formed, for example, by forming a film made of a metal material on the whole silicon substrates 51 and 60, and then forming a mask with a shape patterned after the shape of each electrode on the metal material, and removing a part exposed to an opening of the mask of the metal material, and removing the mask. The mask is formed by a photolithography technique, but at the time of exposure, it is only necessary to focus exposure on only the top surfaces of the silicon substrates 51 and 60, so exposure is easy.

Figure 8A:
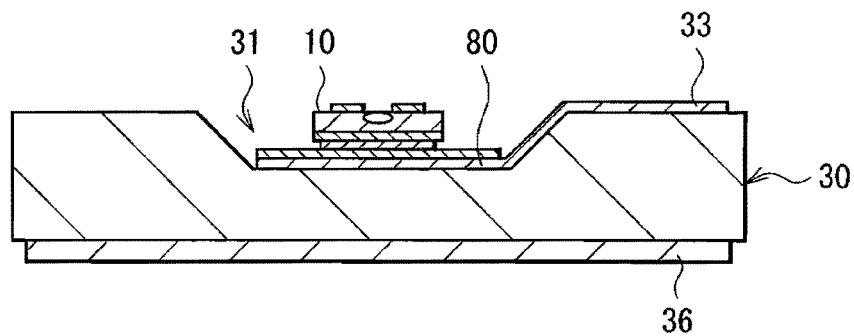
FIGS. 8A and 8B are a sectional view and a plan view of a supporting base according to a modification, respectively.
Figure 8B:
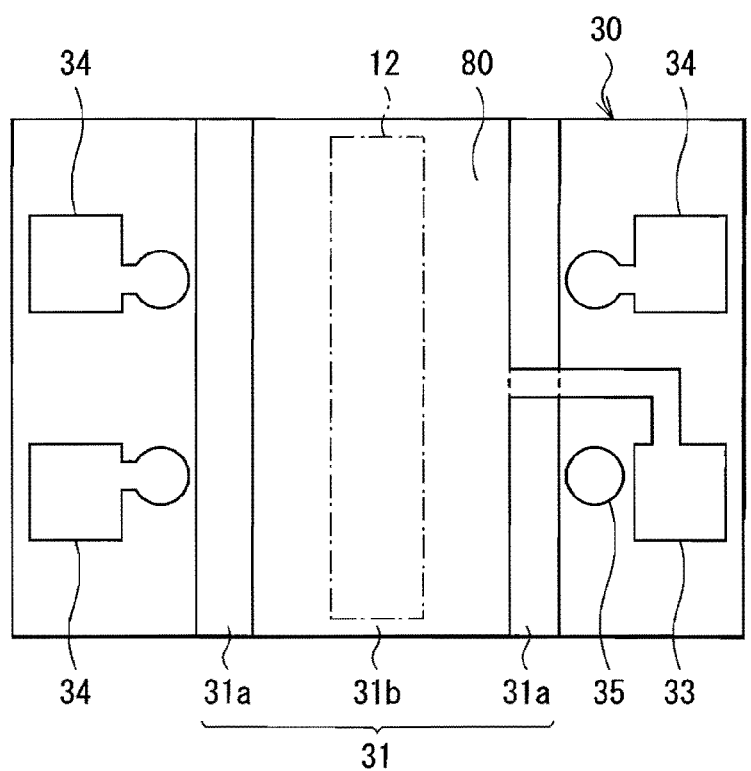
Figure 9:
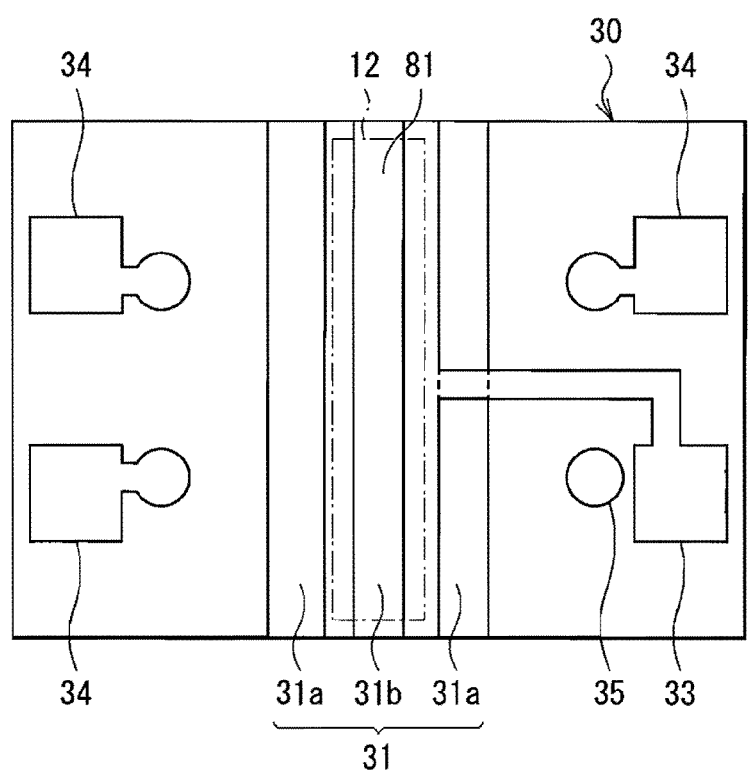
FIG. 9 is a plan view of a supporting base according to another modification.

Moreover, in the above-described embodiment, the case where the p-side electrode 13 of the first light-emitting element 10, the bonding electrode 34 and the dummy electrode 35 are arranged on substantially the same plane is described. However, in some cases, depending on the height of the first light-emitting element 10 or the depth of the depression section 31, the p-side electrode 13 and the bonding electrodes 34 and the dummy electrode 35 are not arranged on substantially the same plane. In this case, the heights are adjustable by the following steps. FIGS. 8A and 8B illustrate a schematic configuration of the supporting base 30 according to a modification. FIGS. 8A and 8B is a sectional view and a plan view of the supporting base 30 onto which the first light-emitting element 10 is mounted, respectively. FIG. 9 illustrates a plan view of the supporting base 30 according to the modification.

Figure 10A:
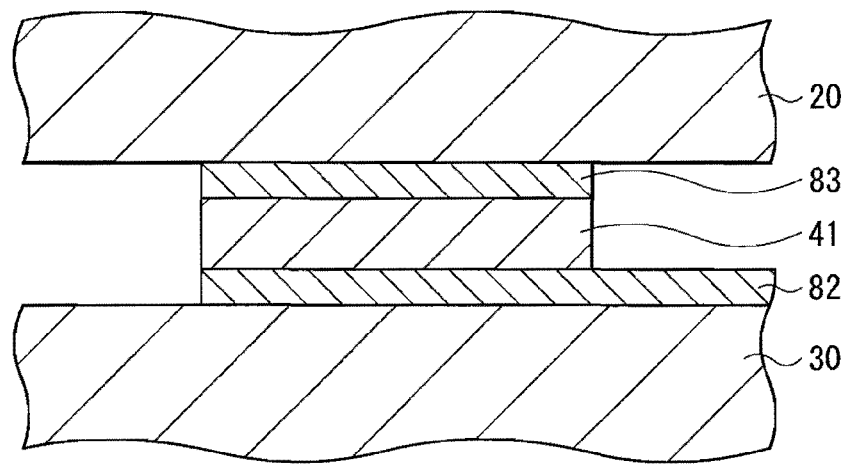
FIGS. 10A and 10B are enlarged sectional views of a bonding part between a p-side electrode of a second light-emitting element and an extraction electrode.
Figure 10B:
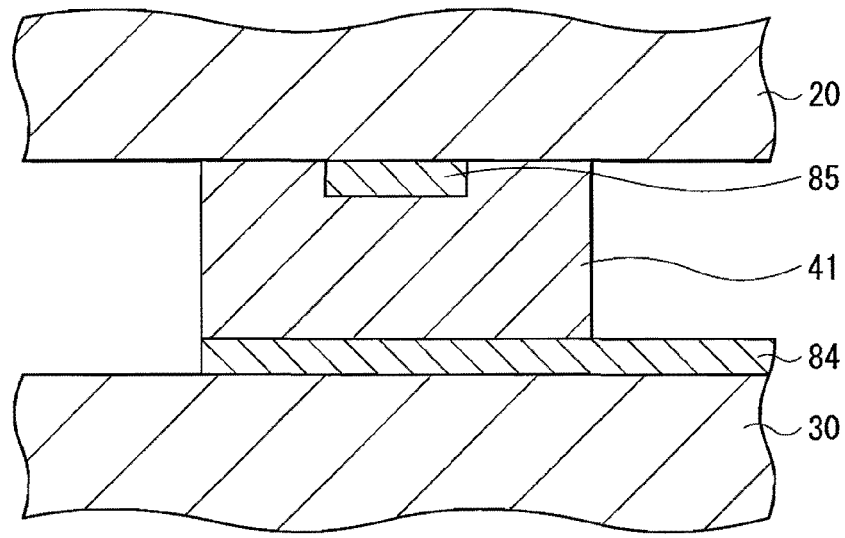

FIGS. 10A and 10B illustrate enlarged sectional views of a bonding part between a p-side electrode of the second light-emitting element 20 and a bonding electrode.

In the case where the height of the first light-emitting element 10 is larger than the depth of the depression section 31, as illustrated in FIGS. 8A and 8B, the area of a mount electrode 80 is increased to be larger than that of the n-side electrode 12 of the first light-emitting element 10, thereby the conductive bonding material 40 is spread over the mount electrode 80 to reduce the thickness of a bonding part between the mount electrode 80 and the n-side electrode 12. As a result, the position in a height direction of the first light-emitting element 10 is lowered, and the position in a height direction of the p-side electrode 13 of the first light-emitting element 10 is allowed to be close to the heights of the bonding electrodes 34 and the dummy electrode 35.

Moreover, in the case where the height of the first light-emitting element 10 is smaller than the depth of the depression section 31, as illustrated in FIG. 9, the area of a mount electrode 81 is reduced to be smaller than that of the n-side electrode 12 of the first light-emitting element 10, thereby a area where the conductive bonding material 40 is spread on the mount electrode 81 is reduced to increase the thickness of a bonding part between the mount electrode 81 and the n-side electrode 12. As a result, the position in the height direction of the first light-emitting element 10 is raised so that the position in the height direction of the p-side electrode 13 of the first light-emitting element 10 is close to the heights of the bonding electrodes 34 and the dummy electrode 35.

Further, in the case where the positions in the height direction of the bonding electrodes and the dummy electrode are higher than the position in the height direction of the p-side electrode 13 of the first light-emitting element 10, as illustrated in FIG. 10A, the planar size of a bonding electrode 82 or the dummy electrode, or/and the planar size of a p-side electrode 83 of the second light-emitting element 20 may be increased. In the case illustrated in FIG. 10A, both of the planar sizes of the bonding electrode 82 and the p-side electrode 83 of the second light-emitting element 20 are increased. Thereby, the conductive bonding material 41 is spread over the bonding electrode 82 or the dummy electrode, or the p-side electrode 83 of the second light-emitting element 20, so the thickness of a bonding part is reduced. As a result, the position in the height direction of the second light-emitting element 20 is lowered, and the second light-emitting element 20 and the first light-emitting element 10 are allowed to be bonded.

Moreover, in the case where the positions in the height direction of the bonding electrodes and the dummy electrode are lower than the position in the height direction of the p-side electrode 13 of the first light-emitting element 10, as illustrated in FIG. 10B, the planar sizes of a bonding electrode 84 or the dummy electrode, or the planar size of a p-side electrode 85 of the second light-emitting element 20 may be reduced. In the case illustrated in FIG. 10B, only the planar size of the p-side electrode 85 of the second light-emitting element 20 is reduced. Thereby, the conductive bonding material 41 is prevented from being spread over the bonding electrode 84 or the dummy electrode 35, or the p-side electrode 85 of the second light-emitting element 20, so the thickness of a bonding part is increased. As a result, the position in the height direction where the second light-emitting element 20 is mounted is raised, and the second light-emitting element 20 is allowed to be bonded to the first light-emitting element 10 and the supporting base 30.

Figure 11A:
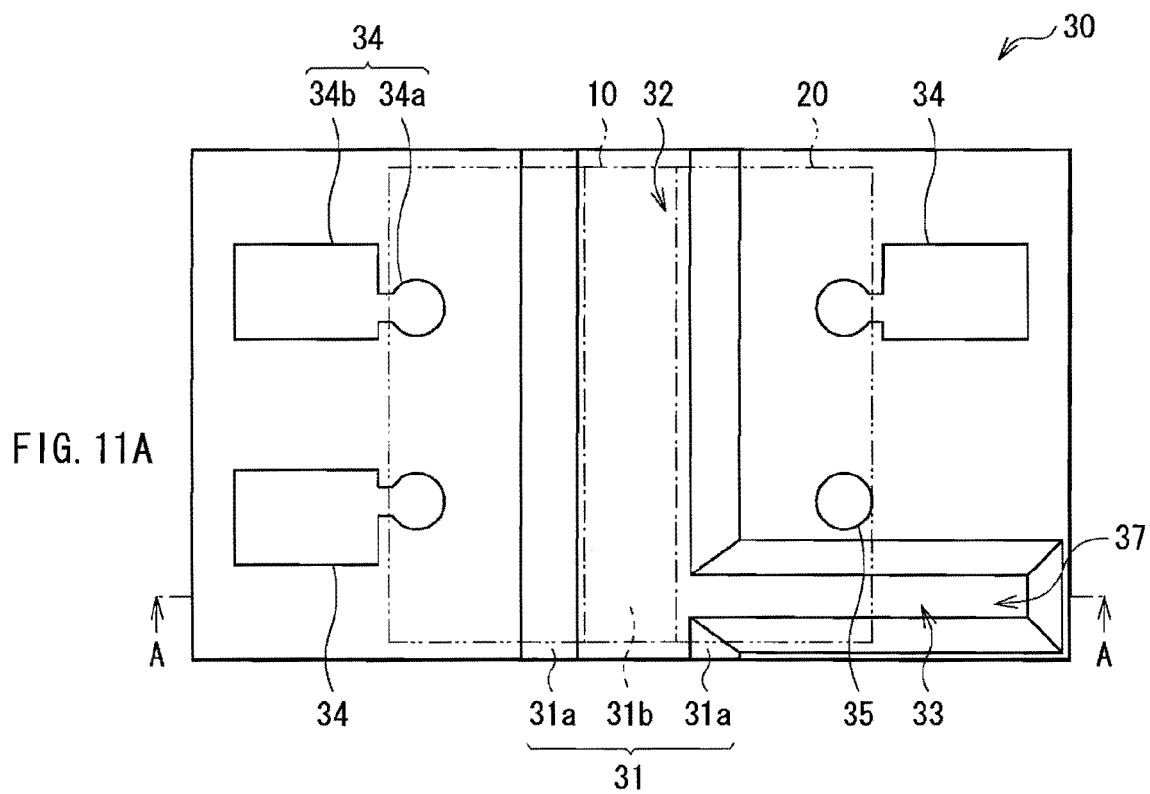
FIGS. 11A and 11B are a plan view and a sectional view of a supporting base for describing a modification of a pad electrode, respectively.
Figure 11B:
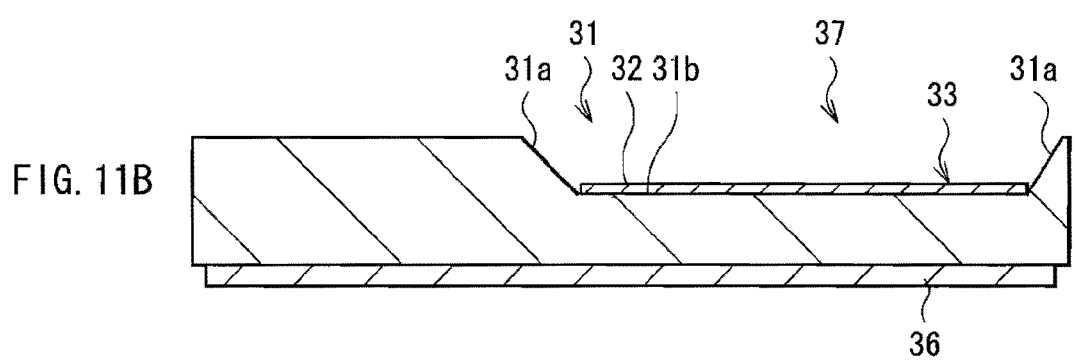

Moreover, in the above-described embodiment, the pad electrode 33 is arranged on the top surface of the supporting base 30, but the pad electrode 33 may be arranged on a surface other than the top surface of the supporting base 30. For example, as illustrated in FIGS. 11A and 11B, in the case where a depression section 37 connected to the depression section 31 is arranged in a surface on a side closer to the first light-emitting element 10 of the supporting base 30 and other than the depression section 31, the pad electrode 33 may be arranged on a bottom surface of the depression section 37. At this time, in the case where the bottom surface of the depression section 37 is positioned on the same plane as the bottom surface 31b of the depression section 31, the pad electrode 33 is positioned on the same plane as the mount electrode 32. In this case, when the pad electrode 33 is connected to the mount electrode 32 on the bottom surface of the depression section 37 or the bottom surface 31b of the depression section 31, the pad electrode 33 is connected to the mount electrode 32 not through an inclined surface of the depression section 37 and the inclined surface 31a of the depression section 31. In the case where the mount electrode 32 and the pad electrode 33 are arranged on the bottom surface of the depression section 37 and the bottom surface 31b of the depression section 31 in such a manner, in a manufacturing step, focal points at the time of exposing a photoresist used for forming these electrodes are adjustable to the same height. As a result, a possibility that wiring widths of the mount electrode 32 and the pad electrode 33 are increased or reduced due to focusing deviation is eliminated.

Figures 12A, 12B:
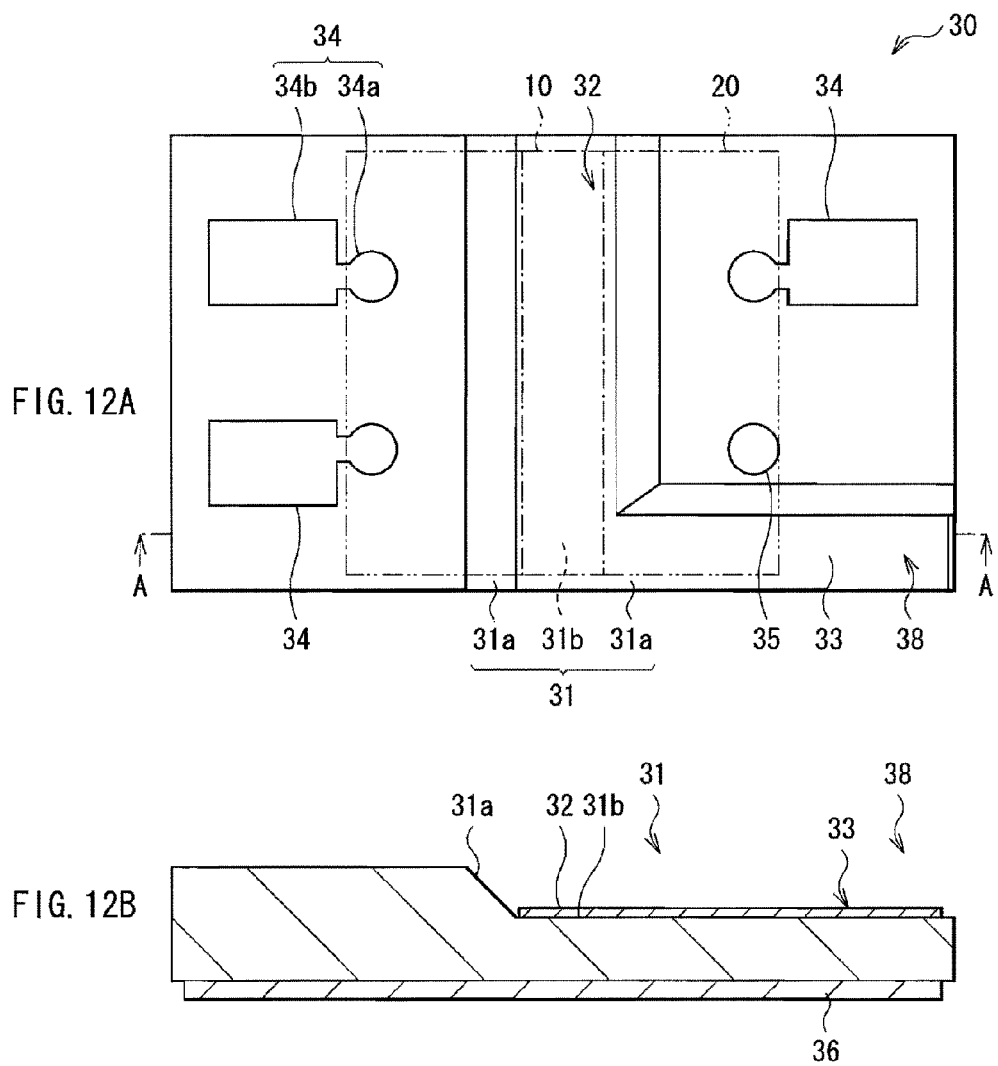
FIGS. 12A and 12B are a plan view and a sectional view of a supporting base for describing another modification of a pad electrode, respectively.

In the above-described modification, instead of the depression section 37, a region having a bottom surface on the same plane as the bottom surface 31b of the depression section 31 may be arranged in the supporting base 30. For example, as illustrated in FIGS. 12A and 12B, a cutaway section 38 which is connected to the depression section 31 and has a bottom surface on the same plane as the bottom surface 31b of the depression section 31 may be arranged on a surface on a side closer to the first light-emitting element 10 of the supporting base 30 and other than the depression section 31. At this time, the pad electrode 33 may be arranged on the bottom surface of the cutaway section 38. Also in this case, as in the case of the above-described modification, a possibility that wiring widths of the mount electrode 32 and the pad electrode 33 are increased or reduced due to focusing deviation is eliminated.

The present application contains subject matter related to that disclosed in Japanese Priority Patent Application JP2009-040756 filed in the Japan Patent Office on Feb. 24, 2009, and Japanese Priority Patent Application JP2009-228037 filed in the Japan Patent Office on Sep. 30, 2009, the entire content of which is hereby incorporated by references.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting device comprising:
    a supporting base including a depression section on a top surface thereof, the depression section having an inclined surface on a side wall thereof, the side wall spacing the depression section from an uppermost section of the top surface;
    a first light-emitting element arranged on a bottom surface of the depression section;
    a second light-emitting element arranged on the first light-emitting element and the supporting base;
    a first electrode (i) arranged on the uppermost section of the top surface of the supporting base, and (ii) spacing the second light-emitting element from the uppermost section of the top surface of the supporting base; and
    a second electrode (i) spacing the first light-emitting element from the depression section of the supporting base, (ii) extending along the inclined surface of the depression section, and (iii) operable to supply electricity to the first light-emitting element,
    wherein,
    the first electrode and the second electrode are laterally spaced from each other along the top surface of the supporting base;
    wherein, the supporting base includes an oxidized film between a first silicon substrate and a second silicon substrate, the depression section is arranged in the second silicon substrate, and the depth of the depression section corresponds to the thickness of the second silicon substrate.

2. The light-emitting device according to claim 1, wherein the supporting base is a silicon substrate.

3. The light-emitting device according to claim 1, wherein the first light-emitting element and the second light-emitting element each are a semiconductor laser.

4. The light-emitting device according to claim 3, wherein the emission wavelength of the first light-emitting element is in a 400-nm band.

5. The light-emitting device according to claim 3, wherein the second light-emitting element includes a plurality of light-emitting points with different emission wavelengths.

6. The light-emitting device according to claim 5, wherein the second light-emitting element includes a light-emitting point for light with an emission wavelength of 600-nm band and a light-emitting point for light with an emission wavelength of 700-nm band.

7. The light-emitting device according to claim 1, wherein the first light-emitting element is substantially contained within the depression.

8. A light-emitting device comprising:
    a supporting base including a depression section on a top surface thereof, the depression section having an inclined surface on a side wall thereof;
    a first light-emitting element arranged on a bottom surface of the depression section; and
    a second light-emitting element arranged on the first light-emitting element and the supporting base;
    a first electrode spacing the first light-emitting element from the depression section of the supporting base; and
    a second electrode on a bottom surface of the depression section, the second electrode (i) extending along the inclined surface of the depression section, and (ii) electrically connected to the first electrode,
    wherein,
    the first light-emitting element includes a third electrode and a fourth electrode on top and bottom surfaces thereof, respectively,
    the second light-emitting element includes a fifth electrode and a sixth electrode on top and bottom surfaces thereof, respectively, and
    the first light-emitting element is electrically connected (i) to the second electrode through the fourth electrode, and (ii) to the sixth electrode through the third electrode.

9. The light-emitting device according to claim 8, wherein the fourth electrode has a larger area than that of the second electrode.

10. The light-emitting device according to claim 8, wherein the fourth electrode has a smaller area than that of the second electrode.

11. The light-emitting device according to claim 8, wherein the height of the third electrode is equal to the height of the first electrode.

12. A light-emitting device comprising:
- a supporting base including a depression section on a top surface thereof, the depression section having an inclined surface on a side wall thereof, the side wall spacing the depression section from an uppermost section of the top surface;
- a first light-emitting element arranged on a bottom surface of the depression section;
- a second light-emitting element arranged on the first light-emitting element and the supporting base;
- a first electrode (i) arranged on the uppermost section of the top surface of the supporting base, and (ii) spacing the second light-emitting element from the uppermost section of the top surface of the supporting base; and
- a second electrode (i) spacing the first light-emitting element from the depression section of the supporting base, (ii) extending along the inclined surface of the depression section, and (iii) operable to supply electricity to the first light-emitting element, wherein,
each of the first and second electrodes includes a p-side electrode and an n-side electrode layered thereon;
wherein, the supporting base includes an oxidized film between a first silicon substrate and a second silicon substrate, the depression section is arranged in the second silicon substrate, and the depth of the depression section corresponds to the thickness of the second silicon substrate.

* * * * *